(12) United States Patent
Kato et al.

(10) Patent No.: US 12,489,441 B2
(45) Date of Patent: Dec. 2, 2025

(54) DRIVING DEVICE AND SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takahiro Kato, Tokyo (JP); Tatsunori Sakano, Tokyo (JP); Ryohei Gejo, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 18 days.

(21) Appl. No.: 18/589,516

(22) Filed: Feb. 28, 2024

(65) Prior Publication Data

US 2025/0088184 A1 Mar. 13, 2025

(30) Foreign Application Priority Data

Sep. 13, 2023 (JP) ................................. 2023-148733

(51) Int. Cl.
*H03K 17/567* (2006.01)
(52) U.S. Cl.
CPC .................................. *H03K 17/567* (2013.01)
(58) Field of Classification Search
CPC ..................................................... H03K 17/567
USPC ................................................ 327/108–112
See application file for complete search history.

(56) References Cited

U.S. PATENT DOCUMENTS 10,811,524 B2    10/2020  Iwakaji et al.
2018/0308757 A1* 10/2018  Kakimoto ............... H10D 8/50
2021/0134791 A1   5/2021  Gejo et al.

FOREIGN PATENT DOCUMENTS

EP    3573109 A1    11/2019
EP    4235786 A1    8/2023
JP    2017135255 A  8/2017
(Continued)

OTHER PUBLICATIONS

Extended Search Report issued on Aug. 20, 2024, in corresponding European Application No. 24160102.0, 9 pages.
(Continued)

*Primary Examiner* — Tomi Skibinski
(74) *Attorney, Agent, or Firm* — Maier & Maier, PLLC

(57) ABSTRACT

An embodiment includes a controller and a driver. The controller determines and sets either of a first mode or a second mode. The first mode is set when a direction of a current into a semiconductor element is a forward direction. The second mode is set when the direction of the current into the semiconductor element is a backward direction. The semiconductor includes a reverse conducting IGBT having dual gate electrodes. The diving unit generates independent gate signals for the dual gate electrodes in accordance with the setting of the controller. And the driver drives the dual gate electrodes as to shorten an off time of the semiconductor element in the first mode, and as to shorten a reverse recovery time in a diode operation of the semiconductor device in the second mode.

18 Claims, 9 Drawing Sheets

(56) References Cited

FOREIGN PATENT DOCUMENTS

JP        2018117044  A        7/2018
JP        2021072407  A        5/2021

OTHER PUBLICATIONS

Findlay et al., "Reverse-Conducting Insulated Gate Bipolar Transistor: A Review of Current Technologies", IEEE Transactions on Electron Devices, XP011694343, Jan. 1, 2019, vol. 66, No. 1, pp. 219-231.
Gejo et al., "4.5 kV Double-gate RC-IEGT with Hole Control Gate"; 34th ISPSD, 2022, pp. 277-280.

* cited by examiner

DRIVING DEVICE AND SEMICONDUCTOR DEVICE

CROSS-REFERENCE TO RELATED APPLICATIONS

This application is based upon and claims the benefit of priority from Japanese Patent Application No. 2023-148733, filed on Sep. 13, 2023; the entire contents of which are incorporated herein by reference.

FIELD

An embodiment relates to a driving device and a semiconductor device.

BACKGROUND

An insulated gate bipolar transistor (IGBT) is widely used as a semiconductor element for power control. There is a reverse conducting IGBT in which an IGBT and a diode are integrated. In such a reverse conducting IGBT, in the case of reducing a switching loss of the integrated diode, a conduction loss increases.

There is a demand for a power module (a semiconductor device) on which the reverse conducting IGBT and a driving device reducing the switching loss of the diode of the reverse conducting IGBT are mounted.

DETAILED DESCRIPTION

Figure 1:
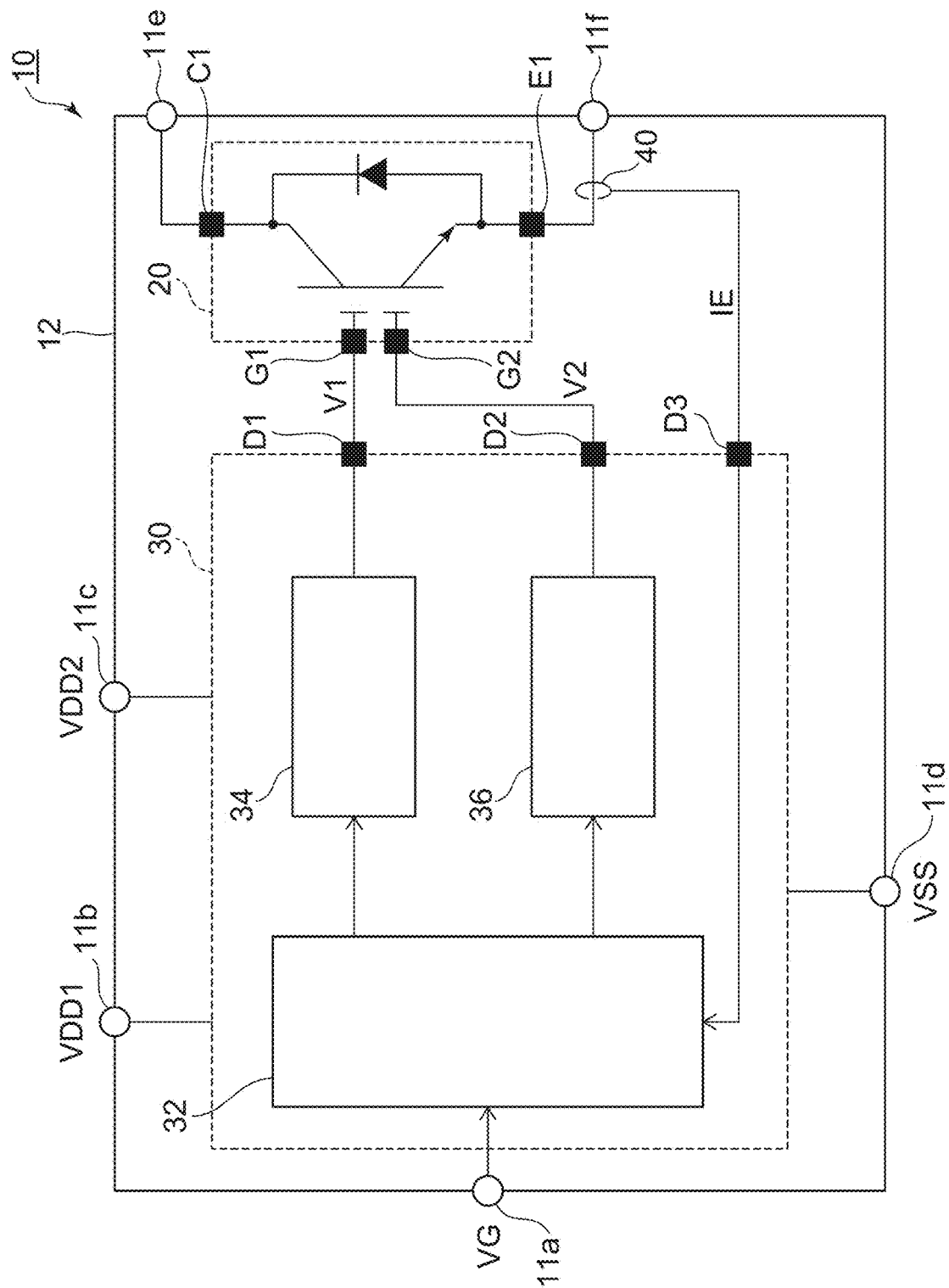
FIG. 1 is a schematic block diagram illustrating a power module according to an embodiment.

A driving device according to an embodiment includes a controller determining and setting either a first mode set when a direction of a current flowing into a semiconductor element including a reverse conducting IGBT including a first gate electrode and a second gate electrode is a forward direction and a second mode set when the direction of the current flowing into the semiconductor element is a backward direction, and a driver generating a first driving signal to output the first driving signal to the first gate electrode, and generating a second driving signal to output the second driving signal to the second gate electrode, in accordance with the setting of the controller. The controller controls the driver, on the basis of a control signal including an ON command for turning on the semiconductor element and an OFF command for turning off the semiconductor element. The driver, in the first mode, transitions the first driving signal to an ON voltage at which the semiconductor element is turned on, at a timing of the ON command, and transitions the first driving signal to an OFF voltage at which the semiconductor element is turned off, at a timing of the OFF command, and transitions the second driving signal to the ON voltage, at the timing of the ON command, and transitions the second signal to the OFF voltage, before a predetermined first time when the first driving signal is transitioned to the OFF voltage, and in the second mode, transitions the first driving signal to the ON voltage, after a predetermined second time when it is detected that the direction of the current flowing into the semiconductor element is the backward direction, and continuously transitions the first driving signal to the OFF voltage for a predetermined third time, and maintains the second driving signal at the OFF voltage.

Hereinafter, each embodiment of the invention will be described with reference to the drawings.

The drawings are schematic or conceptual drawings, and a relationship between the thickness and the width of each part, a size ratio between the parts, or the like is not necessarily the same as that in reality. Even in a case where the same part is shown, the dimensions and ratios may be different in accordance with the drawings.

In the specification and each of the drawings, the same reference numerals will be applied to constituents similar to those already described, and the detailed description will be suitably omitted.

FIG. 1 is a schematic block diagram illustrating a power module according to an embodiment.

As shown in FIG. 1, A power module (a semiconductor device) 10 according to the embodiment includes a switching element (a semiconductor element) 20 and a driving device 30. The power module 10 includes multiple terminals. The multiple terminals include a signal input terminal 11a, power source terminals 11b and 11c, a ground terminal 11d, a collector output terminal 11e, and an emitter output terminal 11f. The power module 10 includes a case 12, and the switching element 20 and the driving device 30 are stored in the case 12. The multiple terminals, for example, are disposed on the case 12. The case 12, for example, is formed of an insulating material.

The power module 10, for example, is connected to a control device through the signal input terminal 11a. The control device generates and outputs a control signal VG. The control signal VG is input to the signal input terminal 11a. The driving device 30 drives the switching element 20, on the basis of the control signal VG. The control signal VG includes a command for turning on the switching element 20 and a command for turning off the switching element 20. The control signal VG, for example, is a gate signal for switching the switching element 20.

The control signal VG, for example, is a signal having a pulse-shaped waveform. The switching element 20 can be turned on when the control signal VG is at an H level, and turned off when the control signal VG is at an L level. The control signal VG is not limited to a pulse signal insofar as an ON timing and an OFF timing of the switching element 20 can be set, and may be a digital signal or an analog signal including ON and OFF phase information. Hereinafter, it may be referred to as an ON command that the control signal VG turns the switching element 20 on, and it may be referred to as an OFF command that the control signal VG turns the switching element 20 off.

A power source for operating the driving device 30 is connected to the power source terminals 11b and 11c. In this example, a low-voltage power source VDD1 for a control unit 32 of the driving device 30 is supplied to the power source terminal 11b, and a high-voltage power source VDD2 for a first driving unit 34 and a second driving unit 36 of the driving device 30 is supplied to the power source terminal 11c. For example, a ground potential VSS of the low-voltage power source and the high-voltage power source is input to the ground terminal 11d.

The collector output terminal 11e and the emitter output terminal 11f are connected to a collector electrode C1 and an emitter electrode E1 of the switching element 20, respectively. The collector electrode C1 is connected to an external circuit through the collector output terminal 11e. The emitter electrode E1 is connected to the external circuit through the emitter output terminal 11f. The external circuit, for example, is a direct-current power source line, other switching elements, a load circuit, or the like configuring a power conversion circuit.

The driving device 30 includes output terminals D1 and D2. The switching element 20 includes a first gate electrode G1 and a second gate electrode G2. The output terminal D1 is connected to the first gate electrode G1, and the output terminal D2 is connected to the second gate electrode G2.

The driving device 30 outputs a first driving signal V1 to the first gate electrode G1 from the output terminal D1. The driving device 30 outputs a second driving signal V2 to the second gate electrode G2 from the output terminal D2.

The switching element 20 is turned on and off, in accordance with the first driving signal V1 and the second driving signal V2.

Hereinafter, the switching element 20, unless otherwise specified, will be described as an n-type reverse conducting IGBT. A current that flows in the collector electrode C1 of the switching element 20 and flows out from the emitter electrode E1 may be referred to as a forward current. A current that flows in the emitter electrode E1 of the switching element 20 and flows out from the collector electrode C1 may be referred to as a backward current. The control of the forward current by the switching element 20 may be referred to as an operation in a forward direction or a forward operation. The control of the backward current by the switching element 20 may be referred to as an operation in a backward direction, a backward operation, or a diode operation. In a case where the switching element is a p-type reverse conducting IGBT, the current that flows in the emitter electrode E1 and flows out from the collector electrode C1 is the forward current, and the current that flows in the collector electrode C1 and flows out from the emitter electrode is the backward current.

A case where the switching element 20 allows the current in the forward direction to flow may indicate that the switching element 20 is turned on, and a state where the switching element is turned on in the forward operation may be referred to as an ON state. A case where the switching element 20 blocks the current in the forward direction may indicate that the switching element 20 is turned off, and a state where the switching element blocks the current in the forward direction may be referred to as an OFF state.

In the power module 10 according to the embodiment, in a case where the switching element 20 is in the OFF state, the switching element 20 enables the backward current to flow. The switching element 20 is the reverse conducting IGBT.

In the power module 10 according to the embodiment, the driving device 30 includes multiple operation modes. The multiple operation modes include a normal mode (a first mode) and a diode mode (a second mode). In the normal mode, the driving device 30 turns on or off the switching element 20, in accordance with the ON command or the OFF command of the control signal VG, to control the forward current.

The diode mode is effective in a case where the control signal VG is in the state of the OFF command. In a case where it is detected that the backward current flows into the switching element 20, the driving device 30 is transitioned to the diode mode. The diode mode is deselected by the driving device 30 inputting the ON command of the control signal VG.

The driving device 30, for example, detects the current flowing into the switching element 20, and determines the direction of the detected current to determine whether the current is the forward current or the backward current. In the example of FIG. 1, a current detector 40 detects the current of the switching element 20. The determination of the operation mode is not limited to the detection of the current flowing into the switching element 20, and for example, the driving device 30 may detect a voltage difference between the voltage of the collector electrode C1 and the voltage of the emitter electrode E1, and determine the direction of the current flowing into the switching element 20 by the sign of the detected voltage difference.

In the diode mode, the driving device 30 performs a carrier recovery operation of recovering the carriers of the switching element 20. More specifically, as described below in association with FIG. 2 and FIG. 3, the driving device 30 recovers an electron that is a majority carrier supplied to an n-type base layer of the switching element 20 performing the diode operation, in accordance with the first driving signal V1 and the second driving signal V2, to block the injection of a minority carrier. A hole that is an excessive minority carrier injected to the n-type base layer is recovered. The majority carrier and the minority carrier are recovered at a suitable timing, and thus, it is possible to improve a reverse recovery characteristic while suppressing an increase in a loss in the diode operation.

The configuration of the driving device 30 will be described.

As shown in FIG. 1, the driving device 30 includes the control unit 32, the first driving unit 34, and the second driving unit 36. The control unit 32 is connected to the signal input terminal 11a. The control unit 32 inputs the control signal VG through the signal input terminal 11a. In the example of FIG. 1, the control unit 32 inputs a detection value of an emitter current IE through a current detection terminal D3 provided in the driving device 30. The control unit 32 determines the direction of the current flowing into the switching element 20, on the basis of the detection value of the emitter current IE. For example, in a case where the sign of the detection value of the emitter current IE is positive, the control unit 32 determines that the current flowing into the switching element 20 is the forward current. In a case where the sign of the emitter current is negative, the control unit 32 determines that the current flowing into the switching element 20 is the backward current.

The control unit 32 determines the operation mode in the case of the OFF command. In a case where it is determined that the backward current does not flow into the switching element 20, the control unit 32 sets the operation mode to the normal mode. In a case where it is determined that the backward current flows into the switching element 20, the control unit 32 sets the operation mode to the diode mode. The control unit 32 determines whether the backward current flows into the switching element 20, for example, on the basis of a threshold value set in advance. As the threshold value, any suitable value is set. In a case where the absolute value of the size of the detected backward current is greater than the absolute value of the threshold value, the control unit 32 determines that the backward current flows into the switching element 20.

The control unit 32 outputs a command to the first driving unit 34 and the second driving unit 36 to generate the driving signal, in accordance with the set operation mode.

The first driving unit 34 generates the first driving signal V1, on the basis of the command from the control unit 32, and outputs the first driving signal to the first gate electrode G1 through the output terminal D1. The second driving unit 36 generates the second driving signal V2, on the basis of the command from the control unit 32, and outputs the second driving signal to the second gate electrode G2 through the output terminal D2.

The first driving signal V1 is applied between the first gate electrode G1 and the emitter electrode E1 of the switching element 20. The second driving signal V2 is applied between the second gate electrode G2 and the emitter electrode E1 of the switching element 20.

In the normal mode, the first driving unit 34 transitions the first driving signal V1 to a voltage higher than the gate threshold voltage of the switching element 20, in accordance with a timing of the ON command of the control signal VG. The voltage higher than the gate threshold value of the switching element 20 is referred to as an ON voltage VON. The ON voltage VON, for example, is approximately +15 V.

In the normal mode, the first driving unit 34 transitions the first driving signal V1 to a voltage sufficiently lower than the gate threshold voltage of the switching element 20, in accordance with a timing of the OFF command of the control signal VG. The voltage sufficiently lower than the gate threshold voltage of the switching element 20 is referred to as an OFF voltage VOFF. The OFF voltage VOFF, for example, is approximately −15 V.

In the normal mode, the second driving unit 36 transitions the second driving signal V2 to the ON voltage VON, in accordance with the timing of the ON command of the control signal VG.

In the normal mode, the second driving unit 36 transitions the second driving signal V2 to the OFF voltage VOFF, in accordance with a timing earlier than the timing of the OFF command of the control signal VG.

As described above, in the normal mode, the driving device 30 outputs the first driving signal V1 to the first gate electrode G1 and outputs the second driving signal V2 to the second gate electrode G2, and thus, it is possible to promptly turn off the switching element 20. Driving the switching element 20 in the normal mode by using the second driving signal V2 transitioned to the OFF voltage VOFF before the timing of the OFF command of the control signal VG may be referred to as "double gate driving".

In the diode mode, the first driving unit 34 maintains the first driving signal V1 in the state of the OFF voltage VOFF at a timing when the backward current is detected. After the control unit 32 detects a reverse current, the first driving unit 34 transitions the first driving signal V1 to the ON voltage VON at a timing set in advance, and maintains the ON voltage VON for a period set in advance, and then, transitions the ON voltage to the OFF voltage VOFF. Accordingly, the majority carrier is recovered to block the injection of the minority carrier.

In the diode mode, the second driving unit 36 outputs the second driving signal V2 maintained at the OFF voltage VOFF. Accordingly, the minority carrier is continuously injected, and the excessive minority carrier is recovered.

The operation of the driving device 30 will be described in detail, with reference to the timing chart.

Figure 2:
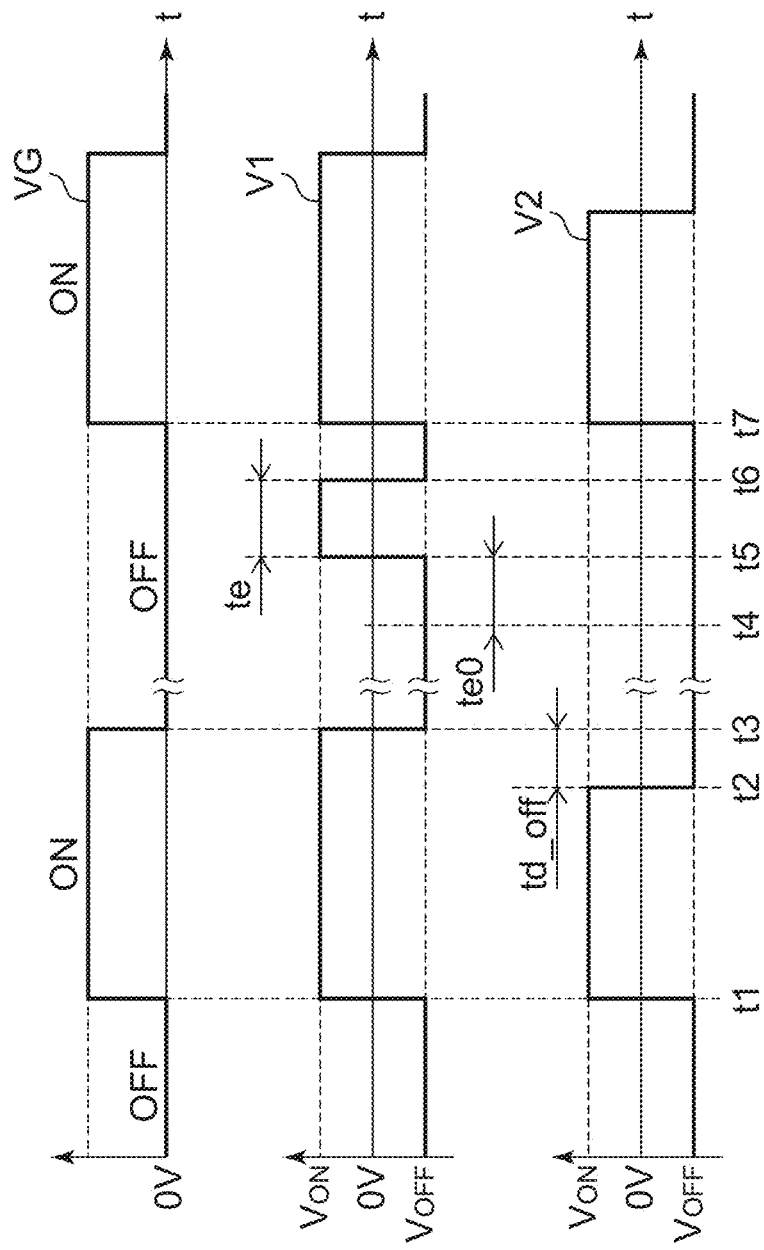
FIG. 2 is a schematic timing chart for describing an operation of a driving device of the power module according to the embodiment.

FIG. 2 is a schematic timing chart for describing the operation of the driving device of the power module according to the embodiment.

The top drawing in FIG. 2 shows a time change of the control signal VG. "ON" shows the ON command, and "OFF" shows the OFF command. In the example of the drawing, the control signal VG is a two-level signal, shows the ON command at an H level, and shows the OFF command at an L level.

The second drawing in FIG. 2 shows a time change of the first driving signal V1.

The bottom drawing in FIG. 2 shows a time change of the second driving signal V2.

In the example of FIG. 2, a period from a time t1 to a time t4 is the normal mode. A period from the time t4 to a time t7 is the diode mode. There is a response delay in each of the control unit 32, the first driving unit 34, and the second driving unit 36, but in the notation of the timing chart in FIG. 2, for simplicity, such a response delay is omitted. Specifically, at each time, a delay time that occurs between the control signal VG and the first driving signal V1 is omitted, and a delay time that occurs between the control signal VG and the second driving signal V2 is omitted. The same applies to FIG. 7A and FIG. 7B.

As shown in FIG. 2, at the time t1, the control signal VG is transitioned to the ON command. The control unit 32 sets the operation mode to the normal mode, in accordance with the ON command of the control signal VG. The control unit 32 commands the first driving unit 34 and the second driving unit 36 to be operated in the normal mode.

The first driving unit 34 transitions the first driving signal V1 to the ON voltage VON and outputs the first driving signal, on the basis of the command of the control unit 32. The second driving unit 36 transitions the second driving signal V2 to the ON voltage VON and outputs the second driving signal. Accordingly, the switching element 20 is turned on to be in the ON state.

The time t2 is a time earlier than the time t3. The time t3 is a time when the control signal VG is transitioned to the OFF command. At the time t2, the second driving unit 36 transitions the second driving signal V2 to the OFF voltage VOFF and outputs the second driving signal. In a period from the time t2 to the time t3, the first driving unit 34 maintains the first driving signal V1 at the ON voltage VON and outputs the first driving signal. According to such double gate driving, in the normal mode, the switching element 20 can be promptly turned off. A time (a first time) td_off from the time t2 to the time t3, for example, is set in advance in the control unit 32.

In a period from the time t3 to the time t4, in the normal mode, the switching element 20 is in the OFF state. For example, in a case where the switching element 20 configuring a bridge circuit, in the period from the time t3 to the time t4, the other switching element of the bridge circuit is turned on. A voltage higher than that of the emitter electrode E1 is applied to the collector electrode C1 of the switching element 20.

At the time t4, the control unit 32 detects the backward current. In a case where the control signal VG is the OFF command, and the backward current of the switching element 20 is detected, the control unit 32 transitions the operation mode to the diode mode. The control unit 32 starts to command the first driving unit 34 and the second driving unit 36 to be operated in the diode mode.

For example, in a case where the switching element 20 configures the bridge circuit, at the time t4, the other switching element of the bridge circuit is turned off, and the switching element 20 performs the diode operation by a back electromotive force of a load that is generated by turning off the switching element. In the diode operation, a voltage higher than that of the collector electrode C1 is applied to the emitter electrode E1 of the switching element 20.

At a time t5, the control unit 32 commands the first driving unit 34 and the second driving unit 36 to perform a majority carrier recovery operation. The first driving unit 34 transitions the first driving signal V1 to the ON voltage VON. The second driving unit 36 maintains the second driving signal V2 at the OFF voltage VOFF.

At a time t6, the first driving unit 34 transitions the first driving signal V1 to the OFF voltage VOFF.

A period from the time t5 to the time t6 is referred to as a majority carrier recovery time (a third time) te. The majority carrier recovery time te, for example, is set in advance in the control unit 32. In addition, a timing (a second time) te0 when the majority carrier recovery time te starts, for example, is suitably set in advance, on the basis of the timing when the backward current is detected.

At the majority carrier recovery time te, in a part of the region of the switching element 20, the electron that is the majority carrier is recovered on the emitter electrode E1 side, and the injection of the hole that is the minority carrier is blocked. In this case, the OFF voltage VOFF is applied to the second gate electrode G2. Accordingly, in a part of the other region of the switching element 20, the hole is continuously injected and recovered.

In a period from the time t6 to the time t7, the collector electrode C1 of the switching element 20 is transitioned to a voltage higher than that of the emitter electrode E1 from a voltage lower than that of the emitter electrode. The voltage of the collector electrode C1 is higher than the voltage of the emitter electrode E1, and thus, the excessive hole is recovered on the emitter electrode E1 side.

In a case where the switching element 20 configures the bridge circuit, the period from the time t4 to the time t7, for example, is a dead time period in the bridge circuit. In the dead time period, both of the switching element 20 and the other switching element are turned off. For example, in a case where the output of the bridge circuit is controlled by pulse width modulation (PWM), in the dead time period, the output is not capable of being controlled, and thus, it is favorable that the dead time period is short.

At the time t7, the control signal VG is transitioned to the ON command. The control unit 32 deselects the diode mode, and transitions the operation mode to the normal mode, in accordance with the ON command of the control signal VG.

As described below in association with FIG. 3 to FIG. 5C, the switching element 20 includes not only a cell region 20e for mainly performing the forward operation and the diode operation, but also a fourth region 20d necessary for the configuration of the switching element 20. In the cell region 20e, a charge amount of holes to be injected is controlled in accordance with the first driving signal V1 and the second driving signal V2. In the fourth region 20d, a unit controlling the injected charge amount of holes is not provided. The fourth region 20d is a region in which a first control electrode 22a and a second control electrode 22b are not provided. The fourth region 20d may include a conductor 22c2. The fourth region 20d is a non-cell region or a finger region. The non-cell region may include a finger region for mutually connecting the control electrodes of the switching element 20. The non-cell region is a region adjacent to the cell region, and a region not including a switching element.

In the diode operation, the voltage of the emitter electrode E1 is higher than the voltage of the collector electrode C1. Accordingly, in the fourth region 20d, the hole is injected to a first semiconductor region 21a that is an n-type base layer from a second semiconductor region 21b that is a p-type base layer electrically connected to the emitter electrode E1. In a case where a voltage difference between the voltage of the emitter electrode E1 and the voltage of the collector electrode is inversed, a reverse recovery current flows, and the reverse recovery characteristic of the switching element 20 is degraded.

In the power module 10 according to the embodiment, the driving device 30 is operated as described above, and thus, in the cell region 20e, the injection amount of the hole is controlled, and the injection amount of the hole in the fourth region 20d is suppressed. Accordingly, the reverse recovery current in the fourth region 20d is suppressed, and the reverse recovery characteristic of the switching element 20 is improved.

Next, the improvement of the reverse recovery characteristic in the diode operation by carrier recovery processing will be described by using a drawing showing the structure of the switching element 20.

Figure 3:
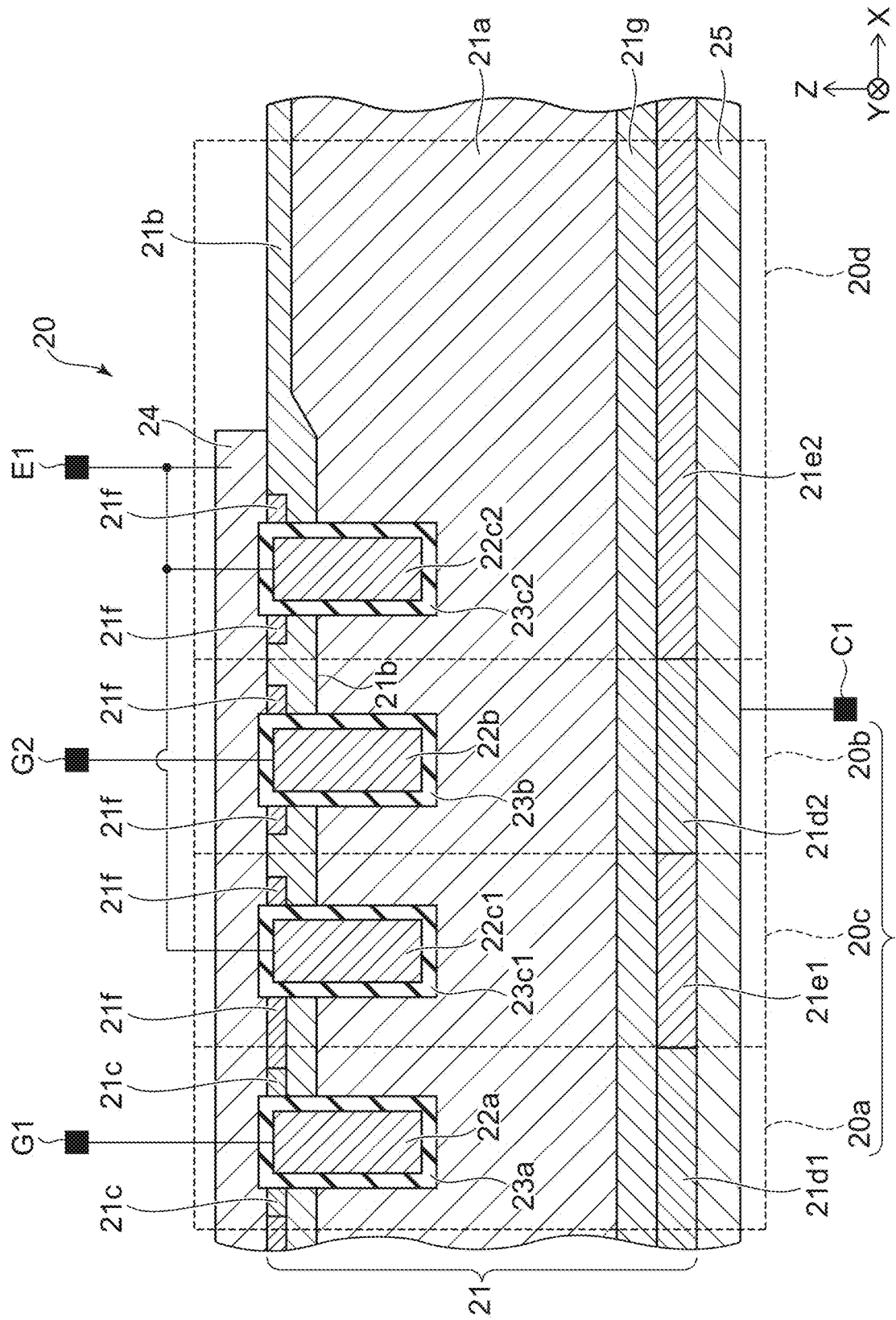
FIG. 3 is a schematic sectional view illustrating a switching element that is a part of the power module according to the embodiment.

FIG. 3 is a schematic sectional view illustrating the switching element that is a part of the power module according to the embodiment.

As shown in FIG. 3, the switching element 20 includes a dual control electrode. Specifically, the switching element 20 includes a semiconductor portion 21, a first electrode 24, a second electrode 25, the first control electrode 22a, and the second control electrode 22b. The first electrode 24 is electrically connected to the emitter electrode E1. The second electrode 25 is electrically connected to the collector electrode C1. The first control electrode 22a and the second control electrode 22b are electrically connected to the first gate electrode G1 and the second gate electrode G2, respectively. The first gate electrode G1 and the second gate electrode G2 are electrically separated from each other.

The semiconductor portion 21 is provided between the first electrode 24 and the second electrode 25. The semiconductor portion 21, for example, contains silicon. The first electrode 24 and the second electrode 25, for example, are a metal layer containing aluminum, titanium, or the like. A direction from the first electrode 24 toward the second electrode 25 is set to a Z-direction. One of directions intersected with the Z-direction is set to an X-direction. One of directions intersected with the Z-direction and the X-direction is set to a Y-direction. The X-direction, the Y-direction, and the Z-direction, for example, are directions orthogonal to each other. The semiconductor portion 21 extends in the X-direction and the Y-direction.

The first control electrode 22a and the second control electrode 22b are provided between the semiconductor portion 21 and the first electrode 24, and electrically separated from each other. Each of the first control electrode 22a and the second control electrode 22b is disposed inside a trench provided in the semiconductor portion 21, and extends into the semiconductor portion 21. In FIG. 3, the first control electrode 22a and the second control electrode 22b, for example, each have a stripe shape extending in the Y-direction, and are parallel in the X-direction. In FIG. 3, to avoid the complication of illustration, one first control electrode 22a and one second control electrode 22b are drawn in one region, but multiple first control electrodes and multiple second control electrodes may be provided in one region. The multiple first control electrodes 22a and the multiple second control electrodes 22b each have a stripe shape extending in the Y-direction, and are disposed in parallel in the X-direction. The multiple first control electrodes 22a and the multiple second control electrodes 22b are not limited to the stripe shape, and may be formed into the shape of a dot, in XY-plan view, and the dot-shaped control electrode may be disposed into the shape of a matrix. The same applies to FIG. 4A to FIG. 5C, and FIG. 7A and FIG. 7B.

The first control electrode 22a is electrically separated from the semiconductor portion 21 by an insulating film 23a. The second control electrode 22b is electrically separated from the semiconductor portion 21 by an insulating film 23b.

Conductors 22c1 and 22c2 are provided between the semiconductor portion 21 and the first electrode 24. The conductor 22c1 is provided between the first control electrode 22a and the second control electrode 22b. The conductor 22c2 is provided between the first control electrode 22a or the second control electrode 22b, which is closest to the outer edge of the cell region 20e, and the non-cell region. The conductors 22c1 and 22c2 are disposed inside the trench provided in the semiconductor portion 21, and each extend into the semiconductor portion 21. The conductor 22c1 is electrically separated from the semiconductor portion 21 by an insulating film 23c1. The conductor 22c2 is electrically separated from the semiconductor portion 21 by an insulating film 23c2. The conductors 22c1 and 22c2 are electrically connected to the emitter electrode E1.

The first electrode 24 is provided on the first control electrode 22a, the second control electrode 22b, and the conductors 22c1 and 22c2. The first control electrode 22a, the second control electrode 22b, and the conductors 22c1 and 22c2 are electrically separated from the first electrode 24 by an interlayer insulating film.

The semiconductor portion 21 includes the first semiconductor region 21a, the second semiconductor region 21b, a third semiconductor region 21c, a first portion 21d1 of a fourth semiconductor region, a second portion 21d2 of the fourth semiconductor region, a third portion 21e1 of a fifth semiconductor region, and a fourth portion 21e2 of the fifth semiconductor region. The first semiconductor region 21a is a first conductivity type. The second semiconductor region 21b is a second conductivity type. The third semiconductor region 21c is a first conductivity type. The first portion 21d1 and the second portion 21d2 are a second conductivity type. The third portion 21e1 and the fourth portion 21e2 are a first conductivity type. Hereinafter, the first conductivity type will be described as an n-type, and the second conductivity type will be described as a p-type.

The first control electrode 22a, the second control electrode 22b, and the conductors 22c1 and 22c2 extend into the first semiconductor region 21a from the surface side of the semiconductor portion 21. The first semiconductor region 21a, for example, is an n-type base layer.

The second semiconductor region 21b is provided between the first semiconductor region 21a and the first electrode 24. The second semiconductor region 21b faces the first control electrode 22a through the insulating film 23a. The second semiconductor region 21b faces the second control electrode 22b through the insulating film 23b. The second semiconductor region 21b faces the conductor 22c1 through the insulating film 23c1. The second semiconductor region 21b faces the conductor 22c2 through the insulating film 23c2. The second semiconductor region 21b, for example, is a p-type base layer. The insulating films 23a and 23b function as a gate insulating film.

The third semiconductor region 21c is selectively provided between the second semiconductor region 21b and the first electrode 24. The third semiconductor region 21c faces the first control electrode 22a through the insulating film 23a. The third semiconductor region 21c is electrically connected to the first electrode 24. The third semiconductor region 21c, for example, is an n-type emitter layer.

A fourth semiconductor region 21d is provided between the second electrode 25 and the first semiconductor region 21a. A fifth semiconductor region 21e is provided between the second electrode 25 and the first semiconductor region 21a. The fourth semiconductor region 21d includes the first portion 21d1 and the second portion 21d2. The fifth semiconductor region 21e includes the third portion 21e1 and the fourth portion 21e2.

The semiconductor portion 21 further includes a sixth semiconductor region 21f of a second conductivity type. The sixth semiconductor region 21f is selectively provided between the second semiconductor region 21b and the first electrode 24. The sixth semiconductor region 21f faces the second control electrode 22b through the insulating film 23b. The sixth semiconductor region 21f faces the conductor 22c1 through the insulating film 23c1. The sixth semiconductor region 21f faces the conductor 22c2 through the insulating film 23c2. The sixth semiconductor region 21f, for example, is a p-type contact layer. A second conductivity type impurity concentration of the sixth semiconductor region 21f is higher than a second conductivity type impurity concentration of the second semiconductor region 21b.

The semiconductor portion 21 further includes a seventh semiconductor region 21g of a first conductivity type. The seventh semiconductor region 21g is provided between the first semiconductor region 21a and the fourth semiconductor region 21d. In addition, the seventh semiconductor region 21g is also provided between the first semiconductor region 21a and the fifth semiconductor region. The seventh semiconductor region 21g, for example, is an n-type buffer layer, and has a first conductivity type impurity with a concentration higher than the first conductivity type impurity concentration of the first semiconductor region 21a.

The switching element 20 includes a first region 20a, a second region 20b, a third region 20c, and the fourth region 20d.

The first region 20a is a region corresponding to the first control electrode 22a, in the first electrode 24, the semiconductor portion 21, and the second electrode 25.

The second region 20b is a region corresponding to the second control electrode 22b, in the first electrode 24, the semiconductor portion 21, and the second electrode 25.

The third region 20c is a region corresponding to the conductor 22c1, in the first electrode 24, the semiconductor portion 21, and the second electrode 25.

A region composed of the first region 20a, the second region 20b, and the third region 20c is referred to as the cell region 20e. In the cell region 20e, the third region 20c is disposed between the first region 20a and the second region 20b.

The fourth region 20d is adjacent to the cell region 20e. The fourth region 20d is a region corresponding to the conductor 22c2 and the fourth portion 21e2, in the first electrode 24, the semiconductor portion 21, and the second electrode 25.

The conductor 22c2 is provided in the vicinity of the boundary with the cell region 20e, in the fourth region 20d.

The fourth region 20d, for example, is a finger region for mutually connecting wiring led from multiple first control electrodes 22a provided in the first region 20a. The fourth region 20d, for example, is a region for mutually connecting wiring led from multiple second control electrodes 22b provided in the second region 20b. The wiring from the first control electrode 22a and the second control electrode 22b is provided on the interlayer insulating film provided on the second semiconductor region 21b.

The fourth region 20d may be provided adjacent to the cell region 20e, may be provided adjacent to the first region 20a, or may be provided adjacent to the second region 20b, as with a specific example of FIG. 3. The fourth region 20d may be provided between two cell regions 20e, or may be provided to surround the cell region 20e. The fourth region 20d may be provided to surround the cell region 20e.

The first portion 21d1 is electrically connected to the second electrode 25. The second portion 21d2 is electrically connected to the second electrode 25. The first portion 21d1 and the second portion 21d2, for example, are a part of a p-type collector layer. The third portion 21e1 is electrically connected to the second electrode 25. The third portion 21e1, for example, is a part of an n-type contact layer. In FIG. 3, the p-type collector layer and the n-type contact layer extend in the Y-direction, and are disposed into the shape of a stripe in parallel in the X-direction. The p-type collector layer and the n-type contact layer may be disposed into the shape of a stripe in parallel in any direction on the XY-plane. The p-type collector layer and the n-type contact layer may be disposed into the shape of a lattice or a dot on the XY-plane. The fourth portion 21e2 is electrically connected to the second electrode 25. The fourth portion 21e2 is provided in the non-cell region.

Multiple conductors 22c1 can be consecutively provided between the first control electrode 22a and the second control electrode 22b. The conductor 22c1 may not be provided between all of the first control electrodes 22a and the second control electrodes 22b. The multiple first control electrodes 22a may be consecutively provided. The multiple second control electrodes 22b may be consecutively provided. In one cell portion, the number of first control electrodes 22a and the number of second control electrodes 22b may be different from each other. For example, the multiple second control electrodes 22b, which are consecutively provided, may be provided between two adjacent first control electrodes 22a.

The function of the first region 20a, the second region 20b, the third region 20c, and the fourth region 20d is as follows.

In the normal mode, the first region 20a and the second region 20b function as IGBT, and control the forward current. In the normal mode, the second region 20b performs an operation of recovering the hole when the switching element 20 is turned off, and improves a turn-off rate. In the normal mode, when the switching element is turned off, the third region 20c and the fourth region 20d support the recovery of the hole in the first region 20a and the second region 20b when the switching element is turned off.

In the diode mode, the first region 20a recovers the electron by forming an inversion layer in the second semiconductor region 21b to block the injection of the hole in the first region 20a. In addition, the first region 20a recovers the hole by forming the inversion layer in the first semiconductor region 21a. In the diode mode, the second region 20b forms a storage layer in the second semiconductor region 21b, and forms the inversion layer in the first semiconductor region 21a to continue the injection of the hole.

In the diode mode, the third region 20c and the fourth region 20d support the recovery of the hole that is excessively injected to each of the first region 20a and the second region 20b.

FIG. 4A to FIG. 5C are schematic sectional views for describing the operation of the switching element.

Figure 4A:
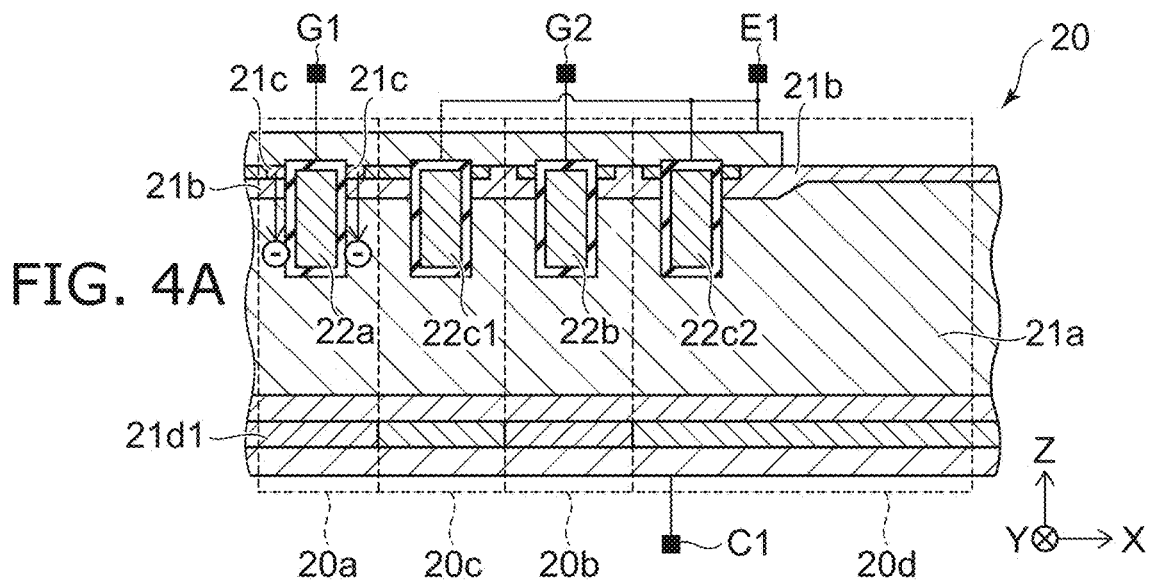
FIG. 4A to FIG. 4C are schematic sectional views for describing an operation of the switching element.
Figure 4B:
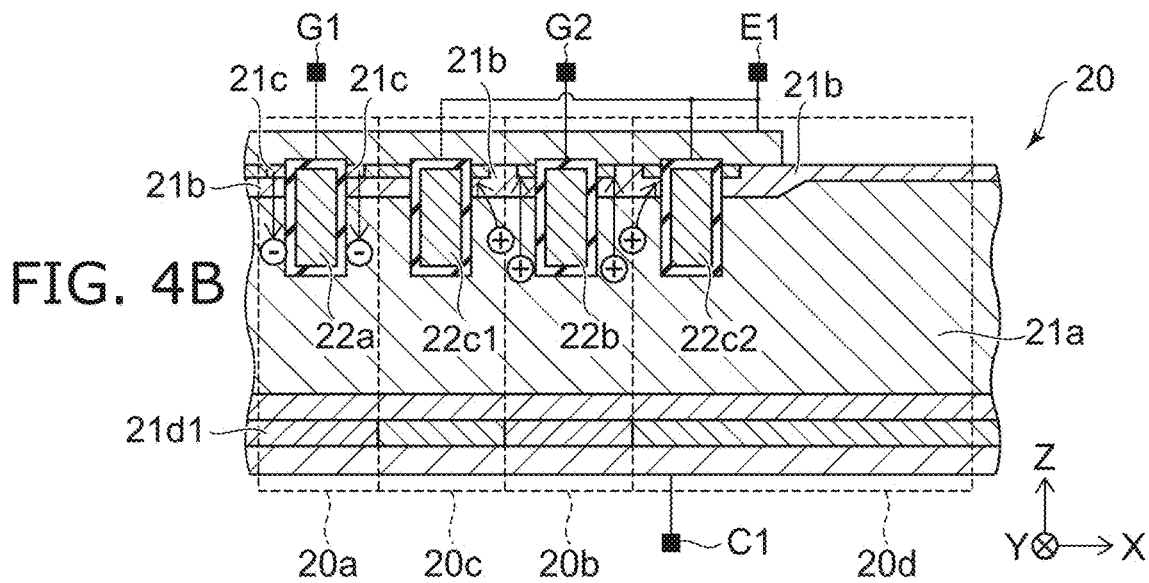
Figure 4C:
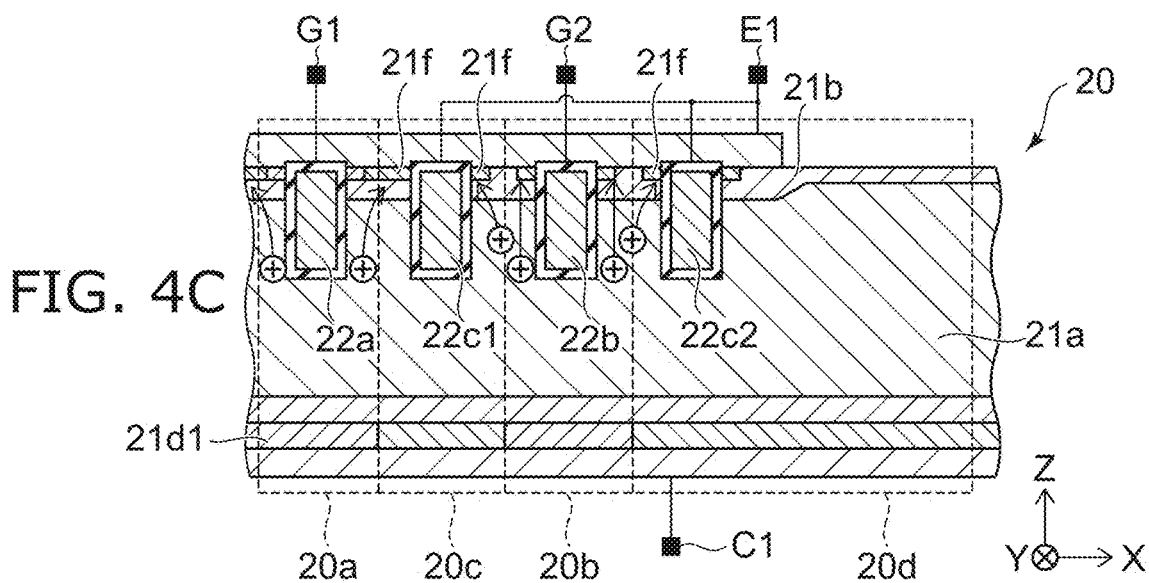

FIG. 4A to FIG. 4C show an operation in a case where the switching element 20 performs the forward operation. By using FIG. 4A to FIG. 4C, a mechanism will be described in which a turn-off operation of the switching element 20 is accelerated by the double gate driving.

Figure 5A:
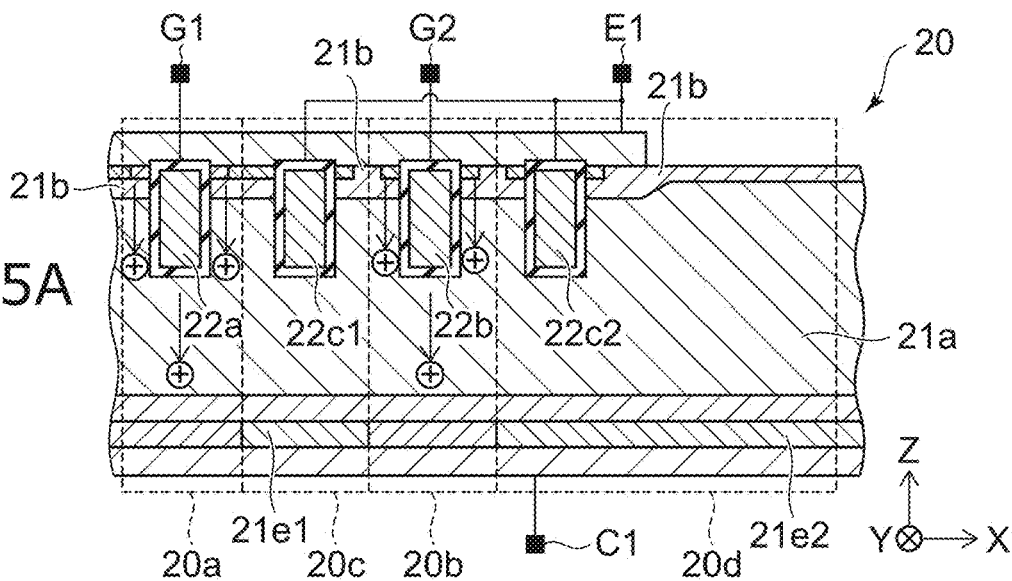
FIG. 5A to FIG. 5C are schematic sectional views for describing the operation of the switching element.
Figure 5B:
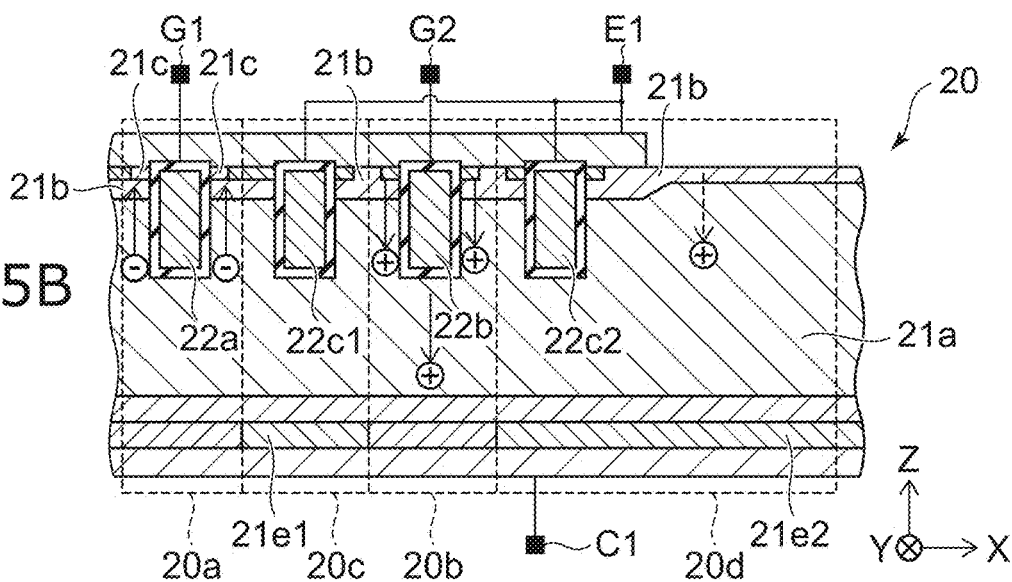
Figure 5C:
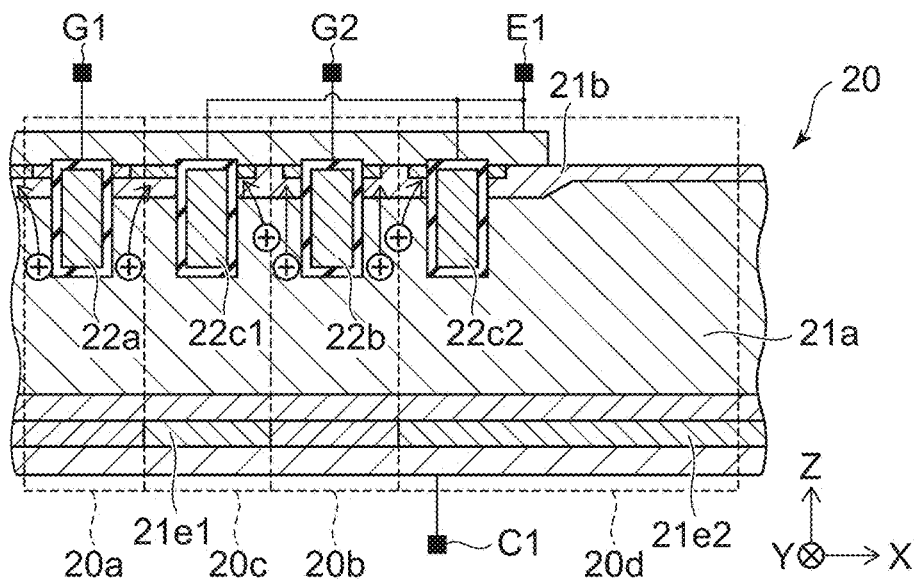

FIG. 5A to FIG. 5C show an operation in a case where the switching element 20 performs the diode operation. By using FIG. 5A to FIG. 5C, a mechanism will be described in which the reverse recovery characteristic is improved by the carrier recovery operation in the diode mode.

In FIG. 4A to FIG. 5C, the electron is notated as "−", and the hole is notated as "+". The same applies to FIG. 8A and FIG. 8B.

FIG. 4A shows the operation in a case where the switching element 20 is turned on, and shows an operation at a timing corresponding to the time t1 in FIG. 2. At the timing corresponding to the time t1 in FIG. 2, the first driving signal V1 supplied to the first gate electrode G1 is transitioned to the ON voltage VON. By applying the ON voltage VON to the first control electrode 22a, the inversion layer is formed in the second semiconductor region 21b of the first region 20a. The electron supplied from the third semiconductor region 21c is supplied to the first semiconductor region 21a through the inversion layer. After that, the hole supplied from the first portion 21d1 is injected to the first semiconductor region 21a, and the switching element 20 is turned on as IGBT.

FIG. 4B shows an operation in a case where the switching element 20 is turned off by the double gate driving. FIG. 4B shows the operation of the switching element 20 at a timing corresponding to the time t2 in FIG. 2. The first driving signal V1 maintained at the ON voltage VON is supplied to the first gate electrode G1. Accordingly, the electron is continuously supplied to the first semiconductor region 21a through the inversion layer formed in the second semiconductor region 21b.

The second driving signal V2 transitioned to the OFF voltage VOFF is supplied to the second gate electrode G2. By applying the OFF voltage VOFF to the second control electrode 22b, the storage layer is formed in the second semiconductor region 21b of the second region 20b. Most of the holes injected to the first semiconductor region 21a in the second region 20b are discharged to the emitter electrode E1 side through the inversion layer of the first semiconductor region 21a and the storage layer of the second semiconductor region 21b. A part of the holes injected to the second region 20b is discharged to the emitter electrode E1 side through the second semiconductor region 21b of each of the third region 20c and the fourth region 20d.

FIG. 4C shows an operation in a case where the switching element 20 is turned off by the OFF command of the control signal VG. FIG. 4C shows the operation of the switching element 20 at a timing corresponding to the time t3 in FIG. 2. At the timing corresponding to the time t3 in FIG. 2, the first driving signal V1 supplied to the first gate electrode G1 is transitioned to the OFF voltage VOFF. Accordingly, the inversion layer is formed in the first semiconductor region 21*a* of the first region 20*a*, and the storage layer is formed in the second semiconductor region 21*b*. The hole of the first semiconductor region 21*a* is discharged through the inversion layer of the first semiconductor region 21*a* and the storage layer of the second semiconductor region 21*b*.

In the second region 20*b*, the second driving signal V2 supplied to the second gate electrode G2 is maintained at the OFF voltage VOFF, and the hole of the first semiconductor region 21*a* is continuously discharged to the emitter electrode E1 through the inversion layer of the first semiconductor region 21*a* and the storage layer of the second semiconductor region 21*b*.

As described above, the second gate electrode G2 is controlled in accordance with the second driving signal V2 to discharge in advance the hole in the first semiconductor region 21*a*, and thus, it is possible to promptly turn off the switching element 20.

FIG. 5A shows an operation at a timing corresponding to the time t4 in FIG. 2. The first driving signal V1 supplied to the first gate electrode G1 is the OFF voltage VOFF, and in the first region 20*a*, the inversion layer is formed in the first semiconductor region 21*a* facing the first control electrode 22*a*. In addition, in the first region 20*a*, the storage layer is formed in the second semiconductor region 21*b* facing the first control electrode 22*a*. The hole of the second semiconductor region 21*b* is injected to the first semiconductor region 21*a* through the storage layer of the second semiconductor region 21*b* and the inversion layer of the first semiconductor region 21*a*.

The second driving signal V2 supplied to the second gate electrode G2 is the OFF voltage VOFF, and in the second region 20*b*, the inversion layer is formed in the first semiconductor region 21*a* facing the second control electrode 22*b*. In addition, the storage layer is formed in the second semiconductor region 21*b* facing the second control electrode 22*b*. The hole of the second semiconductor region 21*b* is injected to the first semiconductor region 21*a* through the storage layer of the second semiconductor region 21*b* and the inversion layer of the first semiconductor region 21*a*.

In the first region 20*a* and the second region 20*b*, the hole is injected through the storage layer, and thus, it is possible to reduce a conduction loss in the diode operation.

FIG. 5B shows an operation in a period corresponding to the majority carrier recovery time te shown in FIG. 2. As shown in FIG. 5B, the first driving signal V1 supplied to the first gate electrode G1 is transitioned to the ON voltage VON, and thus, in the first region 20*a*, the inversion layer is formed in the second semiconductor region 21*b* facing the first control electrode 22*a*. Since the voltage on the emitter electrode E1 side is higher than the voltage on the collector electrode C1 side, the electron supplied from the third portion 21*e*1 of the third region 20*c* is recovered to the emitter electrode E1 through the inversion layer of the second semiconductor region 21*b*, and the injection of the hole in the first region 20*a* is blocked.

At the majority carrier recovery time te, the second driving signal V2 supplied to the second gate electrode G1 is maintained at the OFF voltage VOFF. Accordingly, in the second region 20*b*, a state where the inversion layer is formed in the first semiconductor region 21*b* facing the first control electrode 22*a* is maintained. In addition, in the second semiconductor region 21*b*, a state where the storage layer is formed in the second semiconductor region 21*b* facing the second control electrode 22*b* is maintained. In the second region 20*b*, the hole is continuously injected to the first semiconductor region 21*a* through the storage layer of the second semiconductor region 21*b* and the inversion layer of the first semiconductor region 21*a*.

In the diode mode, a voltage higher than that of the collector electrode C1 is applied to the emitter electrode E1. The first electrode 24 electrically connected to the emitter electrode E1 is provided over the entire surface of the second semiconductor region 21*b* of each of the regions. The charge amount of holes that can be injected to the first semiconductor region 21*a* from the second semiconductor region 21*b* is determined in accordance with the magnitude of energy input to the switching element 20. That is, holes corresponding to the charge amount of holes blocked at the majority carrier recovery time te are injected to the first semiconductor region 21*a* of the second region 20*b*, and thus, as shown by an arrow with a broken line in FIG. 5B, it is possible to suppress the amount of holes injected to the fourth region 20*d*.

FIG. 5C shows a recovery operation of the minority carrier, and shows an operation in a period corresponding to the time t6 to the time t7 in FIG. 2. In the period corresponding to the time t6 to the time t7, a voltage difference between the collector electrode C1 and the emitter electrode E1 is inversed, and the voltage on the emitter electrode E1 side is lower than the voltage on the collector electrode C1 side. The first driving signal V1 supplied to the first gate electrode G1 is transitioned to the OFF voltage VOFF, and thus, in the first region 20*a*, the inversion layer is formed in the first semiconductor region 21*a* facing the first control electrode 22*a*. In addition, in the first semiconductor region 21*a*, the storage layer is formed in the second semiconductor region 21*b* facing the first control electrode 22*a*. Accordingly, the hole of the first semiconductor region 21*a* is discharged to the emitter electrode E1 through the storage layer of the second semiconductor region 21*b* and the inversion layer of the first semiconductor region 21*a*.

The second driving signal V2 supplied to the second gate electrode G2 is maintained at the OFF voltage VOFF. Even in the second region 20*b*, the inversion layer of the first semiconductor region 21*a* and the storage layer of the second semiconductor region 21*b* are maintained, and the hole is discharged to the emitter electrode E1 side through the inversion layer and the storage layer.

The hole of the first region 20*a* and the hole of the second region 20*b* are also diverged and discharged to the seventh semiconductor region 21*f* of the third region 20*c*.

In the fourth region 20*d*, a part of the hole of the adjacent second region 20*b* is diverged and discharged.

In the diode operation, in the first semiconductor region 21*a*, the reverse current flows due to the flow of the hole that is the minority carrier and the electron that is the majority carrier. Since the lifetime of the hole in the first semiconductor region 21*a* is long, it takes time for the hole to be recombined with the electron, and even in a case where a voltage between the collector electrode C1 and the emitter electrode E1 is inversed, the reverse current continuously flows, and thus, a reverse recovery phenomenon occurs. In the power module 10 according to the embodiment, the electron is recovered in advance from the first semiconductor region 21*a* to which the hole is injected to block the injection of the hole. Accordingly, the current due to the recombination is reduced, and the reverse recovery characteristic of the switching element 20 is improved.

In the power module 10 according to the embodiment, at the majority carrier recovery time te, the hole is injected to a part of the adjacent cell region 20*e* of the fourth region 20*d*, and the injection of the hole in the first region 20*a* is blocked. On the other hand, in the first region 20*a*, the excessive hole generated by blocking the injection of the hole is injected to the first semiconductor region 21a through the storage layer by forming the storage layer in the second semiconductor region 21b, in the second region 20b. Accordingly, in the fourth region 20d, the amount of hole injected to the first semiconductor region 21a from the second semiconductor region 21b is suppressed. Accordingly, the influence of the reverse recovery characteristic in the fourth region 20d is reduced, and the reverse recovery characteristic as the switching element 20 is improved.

Figure 6:
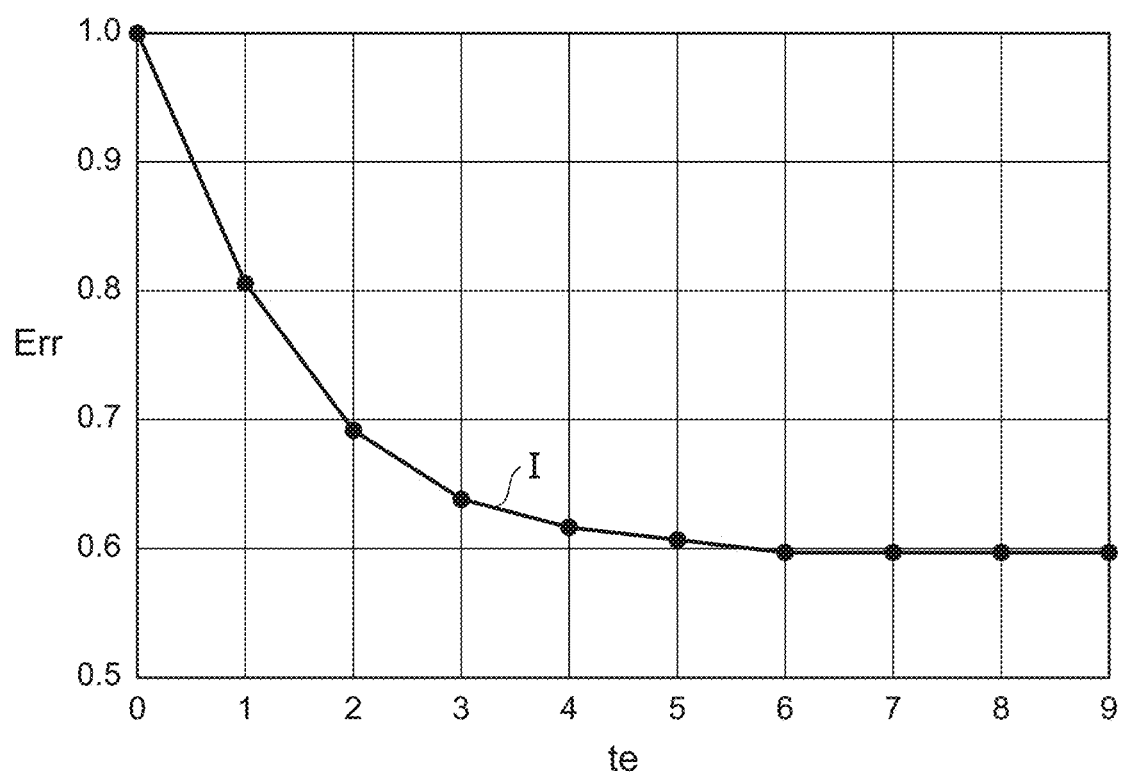
FIG. 6 is a schematic graph showing a characteristic example in the case of operating the power module according to the embodiment.

FIG. 6 is a schematic graph showing a characteristic example in the case of operating the power module according to the embodiment.

In FIG. 6, a horizontal axis shows the majority carrier recovery time te. A vertical axis shows a switching loss Err due to the reverse recovery operation in the diode operation. In FIG. 6, the switching loss Err shows a relative value in a case where the switching loss Err when the majority carrier recovery time te is 0 is set to 1.0. The scale of the majority carrier recovery time te is any scale.

As shown in FIG. 6, the switching loss Err is reduced as the majority carrier recovery time te increases. By sufficiently increasing the majority carrier recovery time te, it is possible to reduce the switching loss Err by 40% or more, compared to a case where the majority carrier recovery time te is set to 0.

Hereinafter, a relationship between the hole injection amount of the cell region 20e and the fourth region 20d and the reverse recovery characteristic will be described by the operation of a driving device of a power module of comparative example.

Figure 7A:
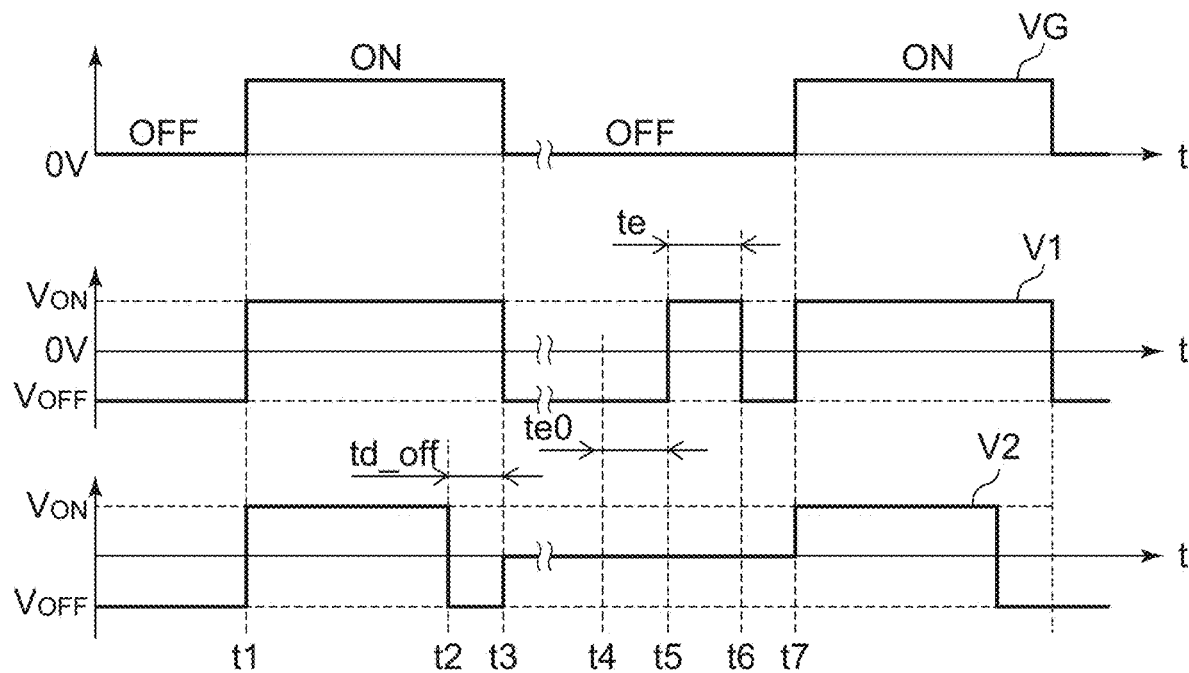
FIG. 7A and FIG. 7B are schematic timing charts for describing an operation of a driving device of a power module of comparative example.
Figure 7B:
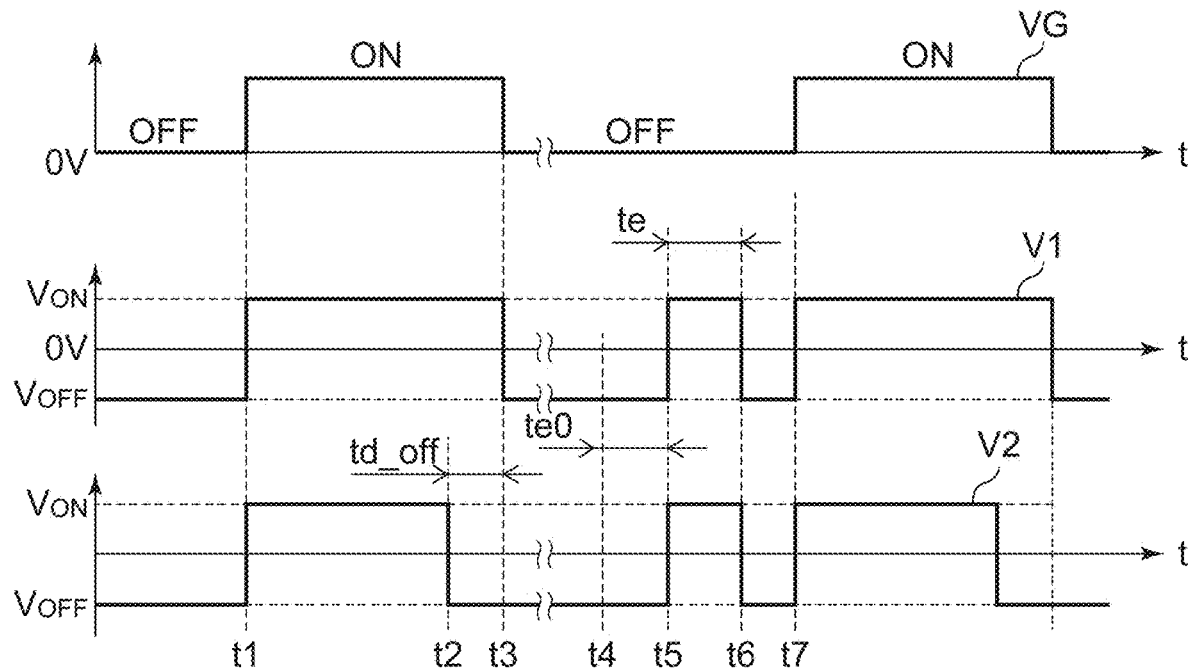

FIG. 7A and FIG. 7B are schematic timing charts for describing the operation of the driving device of the power module of comparative example.

FIG. 7A is different from the timing chart shown in FIG. 2 in that the second driving signal V2 is 0 V from the time t4 to the time t5. In the timing chart of FIG. 7A, the second driving signal V2 is 0 V even in the period from the time t3 to the time t4.

FIG. 7B is different from the timing chart shown in FIG. 2 in that the second driving signal V2 is the ON voltage VON from the time t4 to the time t5.

Figure 8A:
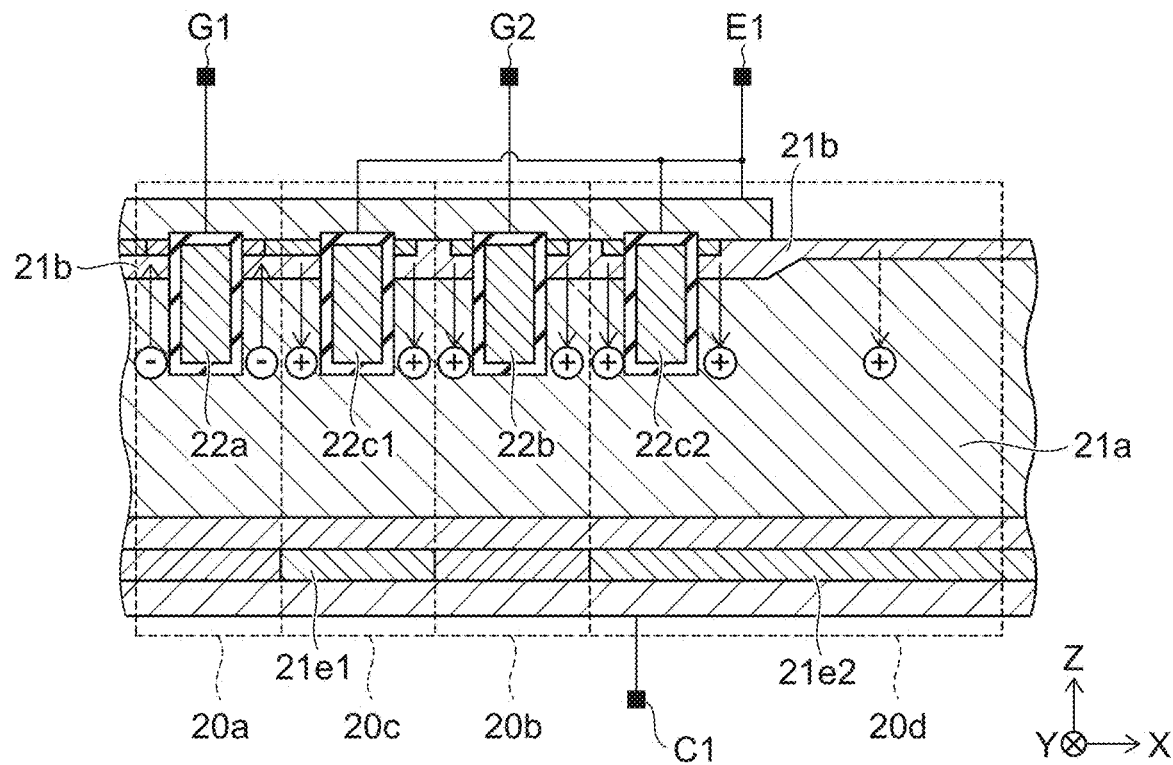
FIG. 8A and FIG. 8B are schematic sectional views for describing an operation of a switching element that is a part of the power module of comparative example.
Figure 8B:
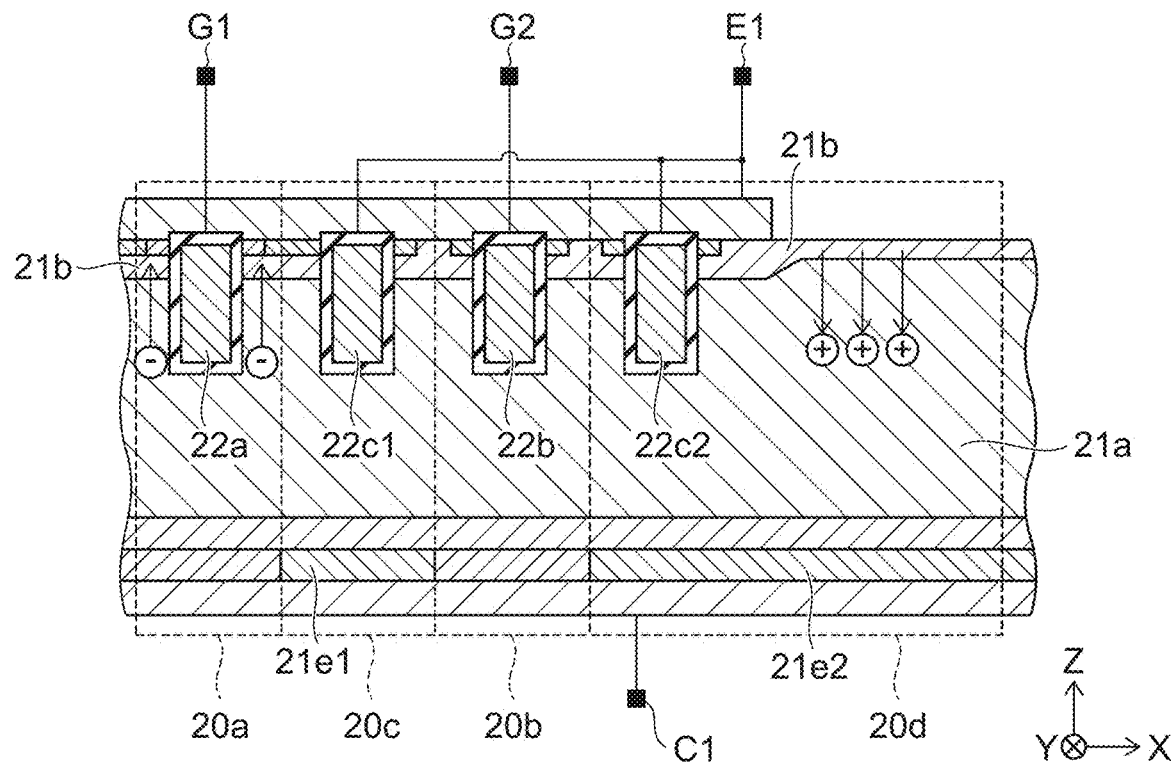

FIG. 8A and FIG. 8B are schematic sectional views for describing the operation of the switching element that is a part of the power module of comparative example.

FIG. 8A and FIG. 8B each show an operation in a period corresponding to the time t5 to the time t6 in FIG. 7A and FIG. 7B. FIG. 8A and FIG. 8B correspond to FIG. 5B.

As shown in FIG. 8A, in the period corresponding to the time t5 to the time t6 in FIG. 7A, in the first region 20a, the inversion layer is formed in the second semiconductor region 21b, and the electron supplied to the first semiconductor region 21a is discharged to the emitter electrode E1 through the inversion layer. This is the same as the case of FIG. 5B.

In the second region 20b, the second driving signal V2 supplied to the second gate electrode G2 is 0 V, and thus, the storage layer is not formed in the second semiconductor region 21b of the second region 20b. Accordingly, in each of the second region 20b, the third region 20c, and the fourth region 20d, holes are injected in a charge amount according to a junction area between the second semiconductor region 21b and the first semiconductor region 21a.

In the case of FIG. 5B, in the second region 20b, the hole is injected through the storage layer formed in the second semiconductor region 21b, and thus, it is possible to increase the charge amount of holes that can be injected per a junction area, compared to the case of FIG. 8A. By setting the injected charge amount of holes in the second region 20b to be greater than the sum of the injected charge amount of holes in the second region 20b and the injected charge amount of holes in the third region 20c in the case of FIG. 8A, it is possible to decrease the injected charge amount of holes in the fourth region 20d.

As shown in FIG. 8B, in the period corresponding to the time t5 to the time t6 in FIG. 7B, the second driving signal V2 supplied to the second gate electrode G2 is set to the OFF voltage VOFF, and thus, the inversion layer is formed in the second semiconductor region 21b of the second region 20b. In the second region 20b, the sixth semiconductor region 21f of the same second conductivity type as that of the second semiconductor region 21b is provided on the second semiconductor region 21b, and thus, the electron is not capable of being discharged to the emitter electrode E1 side through the inversion layer. Accordingly, in the second region 20b, neither the electron nor the hole can be moved, and the reverse current does not flow.

Since the voltage of the emitter electrode E1 is higher than the voltage of the collector electrode C1, in each of the third region 20d and the fourth region 20d, the hole is injected to the first semiconductor region 21a, in accordance with the junction area between the second semiconductor region 21b and the first semiconductor region 21a. In the example of FIG. 8B, since the junction area in the fourth region 20d is larger than the junction area in the third region 20c, holes with a larger charge amount are injected to the first semiconductor region 21a. When compared to the case of FIG. 5B, the charge amount of holes injected to the first semiconductor region 21a in the fourth region 20d is increased by the excessive hole injected through the storage layer in the second region 20b, which may be larger than that in the case of FIG. 8A.

As described above, by controlling the charge amount of holes injected to the second region 20b with a voltage value applied to the second control electrode 22b, it is possible to control the charge amount of holes injected to the first semiconductor region 21a of the fourth region 20d, and control the reverse recovery characteristic.

Figure 9A:
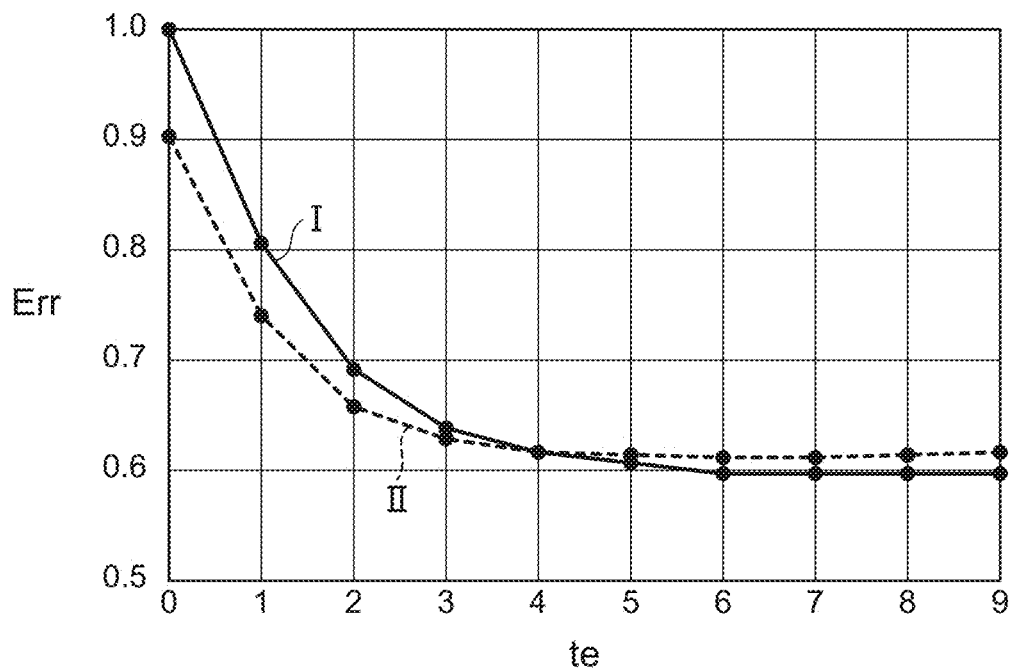
FIG. 9A and FIG. 9B are schematic graphs showing a characteristic example in the case of operating the power module of comparative example.
Figure 9B:
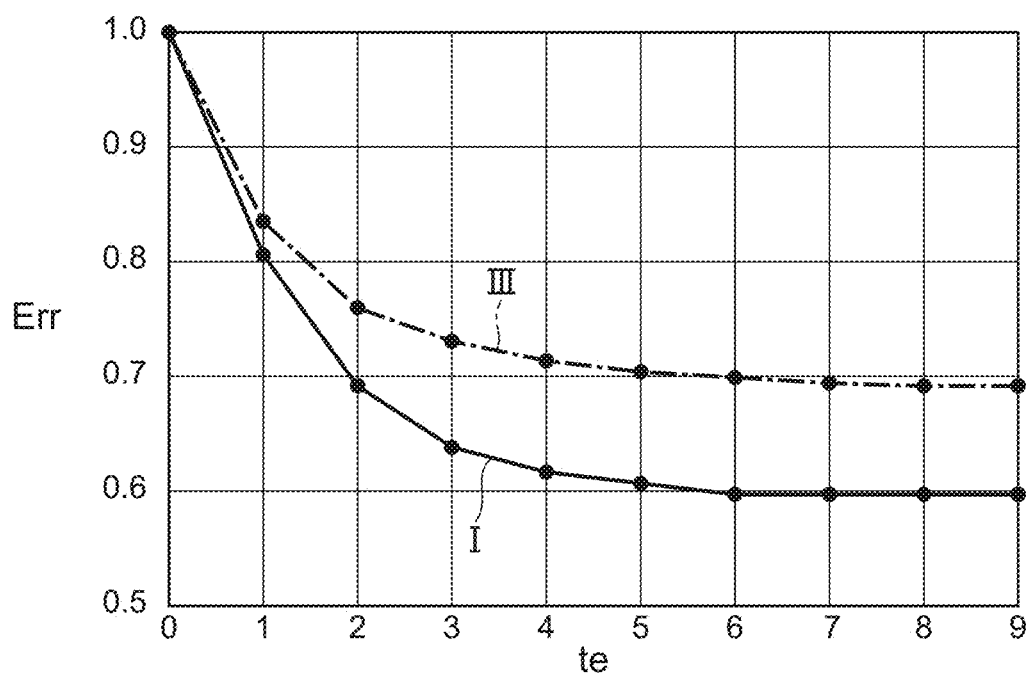

FIG. 9A and FIG. 9B are schematic graphs showing a characteristic example in the case of operating the power module of comparative example.

FIG. 9A is a graph for comparing the plot of the dependence of the switching loss Err on the majority carrier recovery time te in the case of operating the power module in the timing chart of FIG. 7A with the plot shown in FIG. 6. In FIG. 9A, the plot of "I" is a graph in the case of the embodiment shown in FIG. 6. "II" is a graph in the case of comparative example shown by the timing chart in FIG. 7A. The scale of a vertical axis and the scale of a horizontal axis are the same as those in the case of FIG. 6. In the plot of "II", the value of Err is shown by a relative value in a case where Err when te=0 in the plot of "I" is set to 1.0.

As shown in FIG. 9A, by sufficiently increasing the majority carrier recovery time te, it is possible to reduce the switching loss.

FIG. 9B is a graph for comparing the plot of the dependence of the switching loss Err on the majority carrier recovery time te in the case of operating the power module in the timing chart of FIG. 7B with the plot shown in FIG. 6. In FIG. 9B, the plot of "I" is a graph in the case of the embodiment shown in FIG. 6. "III" is a graph in the case of comparative example shown by the timing chart in FIG. 7B. The scale of a vertical axis and the scale of a horizontal axis are the same as those in the case of FIG. 6.

As shown in FIG. 9B, it is found that in the case of the embodiment, the switching loss Err can be improved over the entire range of the majority carrier recovery time te.

As described above, at the majority carrier recovery time te, the switching loss Err can be changed in accordance with the magnitude of the second driving signal V2 supplied to the second gate electrode G2. In the power module 10 according to the embodiment, at the majority carrier recovery time te, by making the second driving signal V2 sufficiently lower than the gate threshold voltage, it is possible to suppress the injection of the hole based on the supply of the excessive electron in the fourth region 20d, and improve the reverse recovery characteristic.

In the above description, an example of a case where the fourth region 20d is provided adjacent to the second region 20b has been described, but the same applies to a case where the fourth region 20d is provided adjacent to the first region 20a.

The effect of the power module 10 according to the embodiment will be described.

The switching element 20 of the power module 10 according to the embodiment is the reverse conducting IGBT including the first gate electrode G1 and the second gate electrode G2, which can be independently controlled. The driving device 30 independently supplies the first driving signal V1 and the second driving signal V2 to the first gate electrode G1 and the second gate electrode G2, respectively.

The driving device 30 determines the operation mode of the power module 10, on the basis of the command of the control signal VG and the current flowing into the switching element 20. In a case where it is detected that the forward current flows into the switching element 20, the driving device 30 sets the operation mode to the normal mode, and turns on and off the switching element 20, in accordance with the control signal VG.

In a case where it is detected that the backward current flows into the switching element 20, the driving device 30 sets the operation mode to the diode mode. In a case where it is detected that the control signal VG is the ON command, the driving device 30 set in the diode mode deselects the diode mode, and sets the operation mode to the normal mode.

In the diode mode, the driving device 30 detects the backward current, and then, starts the carrier recovery operation after the elapse of a predetermined period of time. In the carrier recovery operation, the driving device 30 initially executes majority carrier recovery processing. In the majority carrier recovery processing, the driving device 30 transitions the first driving signal V1 supplied to the first gate electrode G1 to a voltage sufficiently higher than the gate threshold voltage, and continues for the majority carrier recovery time te that is a predetermined period. At the majority carrier recovery time te, the driving device 30 maintains the second driving signal V2 supplied to the second gate electrode G2 at a voltage sufficiently lower than the gate threshold voltage of the switching element 20.

Accordingly, the majority carrier supplied to the first semiconductor region 21a is recovered, and the injection of the minority carrier is blocked. By suppressing the injection of the minority carrier, it is possible to improve the reverse recovery characteristic in the diode operation of the switching element 20.

The switching element 20 includes the semiconductor portion 21, the first electrode 24, the second electrode 25, the first control electrode 22a, and the second control electrode 22b. In the switching element 20, the first electrode 24 is electrically connected to the emitter electrode E1, and the second electrode 25 is electrically connected to the collector electrode C1. In addition, in the switching element 20, the first control electrode 22a is electrically connected to the first gate electrode G1, and the second control electrode 22b is electrically connected to the second gate electrode G2.

In the power module 10 according to the embodiment, the fourth region 20d of the switching element 20 is provided adjacent to the cell region 20e including a region corresponding to each of the first control electrode 22a and the second control electrode. In the diode mode, the fourth region 20d is formed such that the minority carrier can be supplied to the first semiconductor region 21a.

In the power module 10 according to the embodiment, at the majority carrier recovery time te, the voltage applied to the second control electrode 22b is maintained at a value lower than the gate threshold voltage of the switching element 20. Accordingly, the minority carrier is continuously injected to the second region 20b, and thus, the injection of the minority carrier to the fourth region 20d can be suppressed.

By making the voltage applied to the second control electrode 22b sufficiently lower than the gate threshold voltage, reliably forming the inversion layer in the first semiconductor region 21a, and reliably forming the storage layer in the second semiconductor region 21b in the second region 20b, it is possible to inject a sufficient amount of holes. By injecting the sufficient amount of holes, the supply of the electron from the fourth region 20d is accelerated, the supply of the electron to the fourth region 20d is suppressed, and the injection of the hole is suppressed. In the diode operation, the voltage difference between the first electrode 24 and the second electrode 25 is inversed during the reverse recovery, and thus, the excessive hole of the first semiconductor region 21a can be discharged by forming the storage layer in the second semiconductor region 21b in both of the first region 20a and the second region 20b. Accordingly, the reverse recovery current is suppressed, and the reverse recovery operation is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
 a driving device;
 a semiconductor element; and
 a case for storing the driving device and the semiconductor element inside,
 the driving device, comprising:
  a controller determining and setting either a first mode set when a direction of a current flowing into a semiconductor element including a reverse conducting IGBT including a first gate electrode and a second gate electrode is a forward direction or a second mode set when the direction of the current flowing into the semiconductor element is a backward direction; and
  a driver generating a first driving signal to output the first driving signal to the first gate electrode, and generating a second driving signal to output the second driving signal to the second gate electrode, in accordance with the setting of the controller,
the controller controlling the driver, on the basis of a control signal including an ON command for turning on the semiconductor element and an OFF command for turning off the semiconductor element,
the driver,
in the first mode,
  transitioning the first driving signal to an ON voltage at which the semiconductor element is turned on, at a timing of the ON command, and transitioning the first driving signal to an OFF voltage at which the semiconductor element is turned off, at a timing of the OFF command, and
  transitioning the second driving signal to the ON voltage, at the timing of the ON command, and transitioning the second signal to the OFF voltage, before a predetermined first time when the first driving signal is transitioned to the OFF voltage, and
in the second mode,
  transitioning the first driving signal to the ON voltage, after a predetermined second time when it is detected that the current flowing into the semiconductor element is the backward direction, and continuously transitioning the first driving signal to the OFF voltage for a predetermined third time, and
  maintaining the second driving signal at the OFF voltage;
the first gate electrode being electrically connected to a first output of the driving device, and the second gate electrode being electrically connected to a second output of the driving device,
wherein the semiconductor element
includes a cell region, and a non-cell region provided adjacent to the cell region, and
includes a first electrode,
a second electrode, and
a semiconductor portion provided between the first electrode and the second electrode,
the semiconductor portion of the cell region includes
a first semiconductor region of a first conductivity type,
a second semiconductor region of a second conductivity type provided between the first electrode and the first semiconductor region,
a third semiconductor region of the first conductivity type selectively provided between the first electrode and the second semiconductor region, and electrically connected to the first electrode,
a fourth semiconductor region of the second conductivity type selectively provided between the first semiconductor region and the second electrode, and connected to the second electrode,
a fifth semiconductor region of the first conductivity type selectively provided between the first semiconductor region and the second electrode, and connected to the second electrode,
a first control electrode selectively provided between the first electrode and the first semiconductor region, and electrically separated from the first electrode and the semiconductor portion, and
a second control electrode selectively provided between the first electrode and the first semiconductor region, and electrically separated from the first electrode, the semiconductor portion, and the first control electrode, and the non-cell region includes
the first semiconductor region,
the second semiconductor region, and
the fifth semiconductor region of the first conductivity type provided between the first layer and the second electrode, and electrically connected to the second electrode.

2. The semiconductor device according to claim 1,
wherein in the second mode, the ON voltage
is a positive value higher than a gate threshold voltage of the semiconductor element when the semiconductor element is an n-type semiconductor element, and
is a negative value lower than the gate threshold voltage of the semiconductor element when the semiconductor element is a p-type semiconductor element.

3. The semiconductor device according to claim 2,
wherein in a period of the OFF command, the controller determines the direction of the current of the semiconductor element, and
when the second mode is set, the second mode is deselected at the timing of the ON command, and the first mode is set.

4. The semiconductor device according to claim 2,
wherein the controller detects the current of the semiconductor element to determine the direction of the current of the semiconductor element.

5. The semiconductor device according to claim 2,
wherein the controller detects a voltage between two major electrodes of the semiconductor element to determine the direction of the current of the semiconductor element.

6. The semiconductor device according to claim 1,
wherein in the first mode, a voltage at which the semiconductor element is turned off
is a negative value when the semiconductor element is an n-type semiconductor element, and
is a positive value when the semiconductor element is a p-type semiconductor element.

7. The semiconductor device according to claim 6,
wherein in a period of the OFF command, the controller determines the direction of the current of the semiconductor element, and
when the second mode is set, the second mode is deselected at the timing of the ON command, and the first mode is set.

8. The semiconductor device according to claim 6,
wherein the controller detects the current of the semiconductor element to determine the direction of the current of the semiconductor element.

9. The semiconductor device according to claim 6,
wherein the controller detects a voltage between two major electrodes of the semiconductor element to determine the direction of the current of the semiconductor element.

10. The semiconductor device according to claim 1,
wherein in a period of the OFF command, the controller determines the direction of the current of the semiconductor element, and
when the second mode is set, the second mode is deselected at the timing of the ON command, and the first mode is set.

11. The semiconductor device according to claim 10,
wherein the controller detects the current of the semiconductor element to determine the direction of the current of the semiconductor element.

12. The semiconductor device according to claim 10, wherein the controller detects a voltage between two major electrodes of the semiconductor element to determine the direction of the current of the semiconductor element.

13. The semiconductor device according to claim 1, wherein the controller detects the current of the semiconductor element to determine the direction of the current of the semiconductor element.

14. The semiconductor device according to claim 1, wherein the controller detects a voltage between two major electrodes of the semiconductor element to determine the direction of the current of the semiconductor element.

15. The semiconductor device according to claim 1, wherein the first control electrode and the second control electrode extend to a first direction and are parallel in a second direction, the first direction intersects a third direction from the first electrode toward the second electrode, and the second direction intersects the first direction and the third direction.

16. The semiconductor device according to claim 1, wherein the first control electrode and the second control electrode are provided to form into a shape of dots or a shape of a matrix in a plan view.

17. The semiconductor device according to claim 1, wherein the semiconductor portion contain silicon.

18. The semiconductor device according to claim 1, wherein the first electrode and the second electrode contain one of aluminum or titanium.

* * * * *